United States Patent [19]

Hillman et al.

[11] 4,062,463
[45] Dec. 13, 1977

[54] AUTOMATED SINGLE CASSETTE LOAD MECHANISM FOR SCRUBBER

[75] Inventors: Gary Hillman, Livingston; Michael J. Devico, Chatham, both of N.J.

[73] Assignee: Machine Technology, Inc., East Hanover, N.J.

[21] Appl. No.: 685,303

[22] Filed: May 11, 1976

[51] Int. Cl.² .............................................. B65H 1/06
[52] U.S. Cl. .................................. 214/301; 214/1 BT
[58] Field of Search ............... 214/1 BB, 1 BT, 1 BS, 214/1 BH, 16.4 R, 16.4 A, 301, 309, 310

[56] References Cited

U.S. PATENT DOCUMENTS

| | | | |
|---|---|---|---|
| 3,516,386 | 6/1970 | Landwehr et al. | 214/1 BC |
| 3,645,581 | 2/1972 | Lasch, Jr. et al. | 214/1 BT |

OTHER PUBLICATIONS

IBM Technical Disclosure Bulletin, vol. 16, No. 2, by Fink et al., pp. 427–428 (7/1973).

Primary Examiner—Lawrence J. Oresky
Attorney, Agent, or Firm—Lerner, David, Littenberg & Samuel

[57] ABSTRACT

Apparatus is provided for transferring a selected one of a plurality of workpieces, such as silicon wafers or masks, from within a cassette containing the workpieces to a processing station for scrubbing, etching, etc. The apparatus includes a wafer-supporting arm which is movable between a retracted position within the cassette and a scrubbing station for moving the selected one of the silicon wafers from its position within the cassette to the scrubbing station and for returning the selected wafer from the scrubbing station to the cassette. A selection device then operates to move the cassette downwardly so that the next silicon wafer to be cleaned is in position to be picked up by the wafer-supporting arm when it is next moved between its retracted position and the scrubbing station.

17 Claims, 8 Drawing Figures

AUTOMATED SINGLE CASSETTE LOAD MECHANISM FOR SCRUBBER

FIELD OF THE INVENTION

The present invention relates generally to automated material-handling apparatus, such as automated scrubbers for precision cleaning of silicon wafers, and specifically to an improved automated scrubber which includes a novel transport system employing a single cassette from which silicon wafers to be cleaned are transferred to a scrubbing station and after cleaning, are returned to the same cassette.

BACKGROUND OF THE INVENTION

In recent years, a number of different types of automated scrubbers for precision cleaning of silicon wafers have been developed. Typically, such automated scrubbers include two cassettes, a load cassette and an unload cassette with a scrubbing station therebetween. In such prior art arrangements, the silicon wafer to be cleaned is typically withdrawn from the load cassette and transferred to the scrubbing station. After cleaning, the scrubbed silicon wafer is then transferred to a different cassette, that is, the unload cassette.

However, such prior art arrangements have not been wholly satisfactory. More particularly, the use of two different cassettes, one for loading the silicon wafers to be cleaned to a scrubbing station and an unload cassette for receiving the wafers after they have been cleaned, results in automated apparatus which is quite complex having many moving parts, which requires costly maintenance and which system is more expensive to produce.

Broadly, it is an object of the present invention to provide an automated material-handling apparatus, such as an automated scrubber, which overcomes one or more of the aforesaid drawbacks. Specifically, it is within the contemplation of the present invention to provide an improved automated scrubber which utilizes only a single cassette for loading and unloading the silicon wafers to and from a scrubbing station.

It is a further object of the present invention to provide an improved automated single-cassette load mechanism for scrubbers which includes a wafer-supporting arm which moves directly through the cassette carrying the wafers to move a selected one of the wafers from its position within the cassette to the scrubbing station and for returning the selected wafer from the scrubbing station to the cassette.

SUMMARY OF THE INVENTION

Briefly, in accordance with the principles of the present invention, an improved automated single-cassette load mechanism is provided for transferring a selected one of a plurality of workpieces, such as silicon wafers, from within a cassette containing the workpieces to a processing station. In a preferred embodiment, the apparatus includes a wafer-supporting arm movable between a retracted position and an extended position corresponding to a scrubbing station for moving the selected one of the silicon wafers from its position within the cassette to the scrubbing station and for returning the selected wafer from the scrubbing station to the cassette. The cassette is longitudinally aligned between the retracted position of the wafer-supporting arm and the scrubbing station so that as the wafer-supporting arm moves between the retracted position and the scrubbing station to transfer the selected wafer to and from the cassette, the wafer-supporting arm moves from its retracted position in the cassette to pick up the selected wafer on its forward movement to the scrubbing station, and on its return movement, the wafer-supporting arm is retracted through the cassette to deposit the scrubbed silicon wafer in the cassette, and the wafer-supporting arm continues movement to its retracted position. In this manner, the selection means can then operate to move the cassette downwardly so that the next silicon wafer to be cleaned will be in position for selection during the next forward movement of the wafer-supporting arm from its retracted position toward the scrubbing station.

Advantageously, the apparatus of the present invention includes a novel arrangement wherein only a single cassette is employed for transferring the silicon wafers to the scrubbing station and for receiving them after they are cleaned. As a result, the apparatus of the present invention eliminates the need for the complex mechanisms employed in the prior art arrangements which utilize two cassettes, one for transferring silicon wafers to a scrubbing station and one cassette for receiving the silicon wafers after they are scrubbed, and also avoids the need for the complex transfer mechanisms required for transferring the silicon wafers from the load cassette to the scrubbing station and then to the unload cassette.

A further advantage of the apparatus of the present invention is that it utilizes an arrangement wherein the silicon wafer-supporting arm, which is movable between a retracted position and a scrubbing station, actually moves through the cassette to transfer the silicon wafer therefrom to the scrubbing station, and then the wafer-supporting arm is retracted through the cassette to return the scrubbed silicon wafer from the scrubbing station to the cassette. Accordingly, this arrangement in the present invention avoids the need for the complex transfer devices required in prior art arrangements utilizing two cassettes for loading and unloading of the silicon wafers.

Finally, the apparatus of the present invention also includes novel selection means for selecting a selected one of the silicon wafers contained in the cassette. The novel selection means includes means for moving the cassette downwardly so that the next silicon wafer positioned within the cassette may be moved into position at the scrubbing station on the next forward movement of the wafer-supporting arm from its retracted position toward the scrubbing station.

BRIEF DESCRIPTION OF THE DRAWINGS

Further objects, features, and advantages of the present invention will become apparent upon the consideration of the following detail description of a presently preferred embodiment when taken in conjunction with the accompanying drawing, wherein.

DETAILED DISCUSSION OF PREFERRED EMBODIMENT OF THE INVENTION

Figure 1:
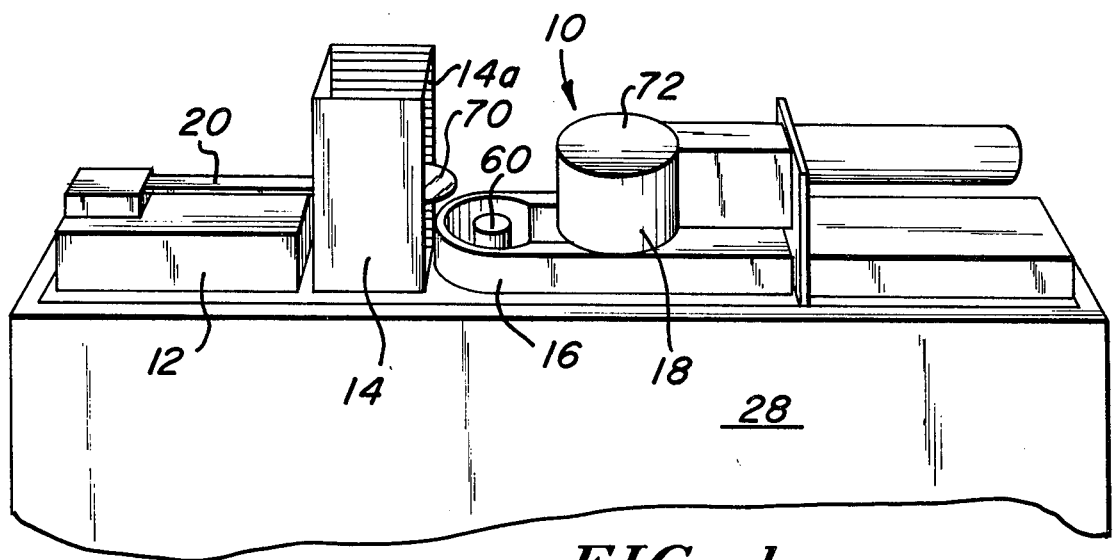
FIG. 1 is a perspective view of an automated scrubber employing the novel features of the present invention.

Referring now to FIG. 1, there is shown the improved automated handling apparatus of the present invention, generally designated by the reference numeral 10. It should be understood that although the present invention has been illustrated as embodied in an automated scrubber for wafers, the invention is not limited to this embodiment, and may be employed in the handling of other workpieces, such as masks. Moreover, the invention may be employed to coat, etch, develop, etc., workpieces, such as wafers and masks. In the preferred embodiment, the automated scrubber includes transfer means 12, a cassette 14 for housing a plurality of silicon wafers 70 to be precision cleaned, a scrubbing station 16 including a chuck 60 for receiving the silicon wafers to be scrubbed, and a brush assembly 18 movable into and out of position at the scrubbing station 16 for precision cleaning of the silicon wafers. All of the foregoing are in longitudinal alignment on a frame member 28.

Figure 2:
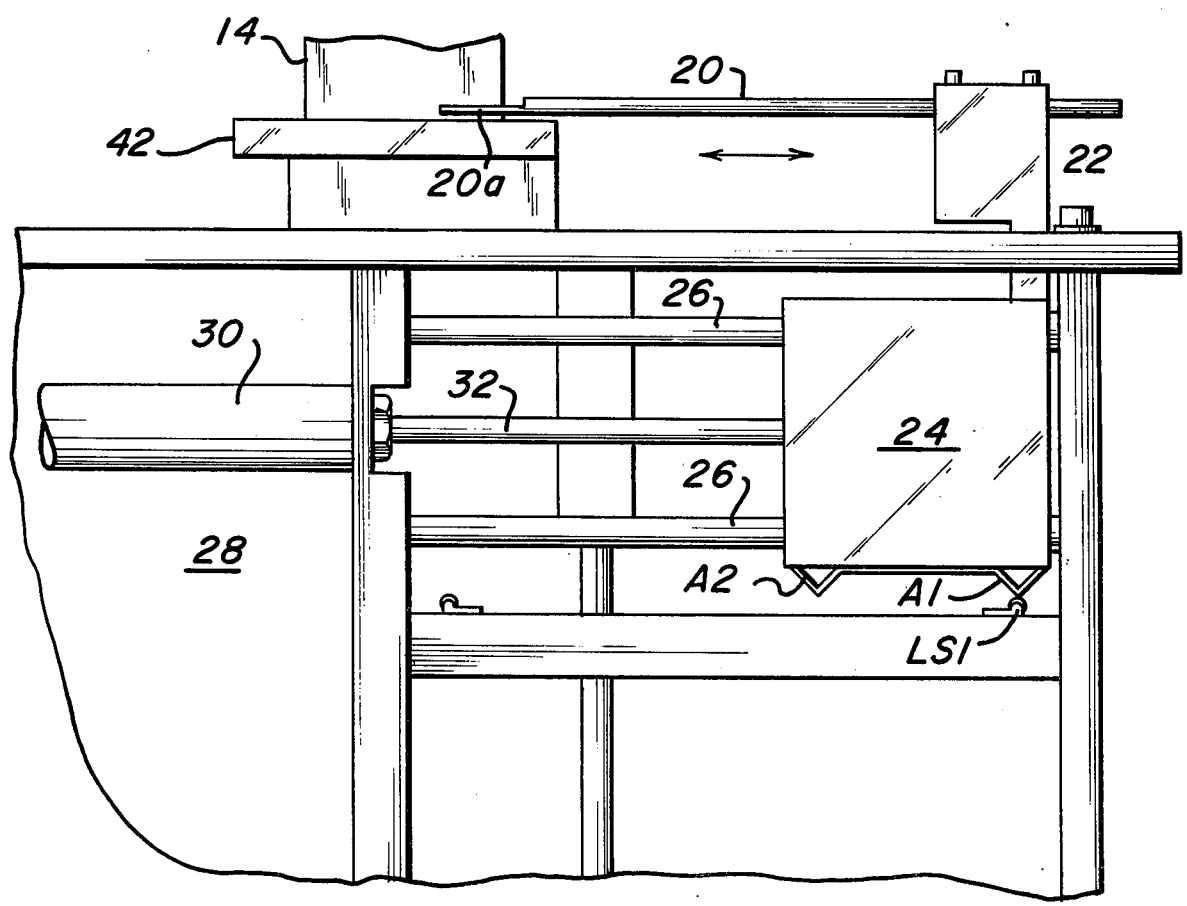
FIG. 2 is a side elevational view, partially broken away, illustrating the silicon wafer-supporting arm and the drive arrangement therefor.

Turning now to FIG. 2, transfer means 12 is shown in detail and includes a wafer-supporting arm 20 fixedly attached to a movable carrier 22 and a drive mechanism 24 for moving arm 20 between a retracted position (shown) and an extended position (at scrubbing station 16). Drive mechanism 24 is slidably movable on guide rods 26 mounted on frame 28 and is pneumatically driven by a pneumatic cylinder 30 and a piston 32 in a conventional manner to move arm 20 between its retracted and extended positions. Also mounted on frame 28 is a pair of limit switches designated as the retract limit switch LS1 and the extend limit switch LS2. In addition, drive mechanism 24 includes limit switch actuators designated A1 and A2. As will be clear from FIG. 2, when wafer-supporting arm 20 and drive mechanism 24 are in their retracted position, actuator A1 engages retract limit switch LS1 to perform a series of operations to be explained. Similarly, when wafer-supporting arm 20 and drive mechanism 24 are in their extended position, actuator A2 engages limit switch LS2 to perform operations in a manner to be explained more fully below.

Figure 3:
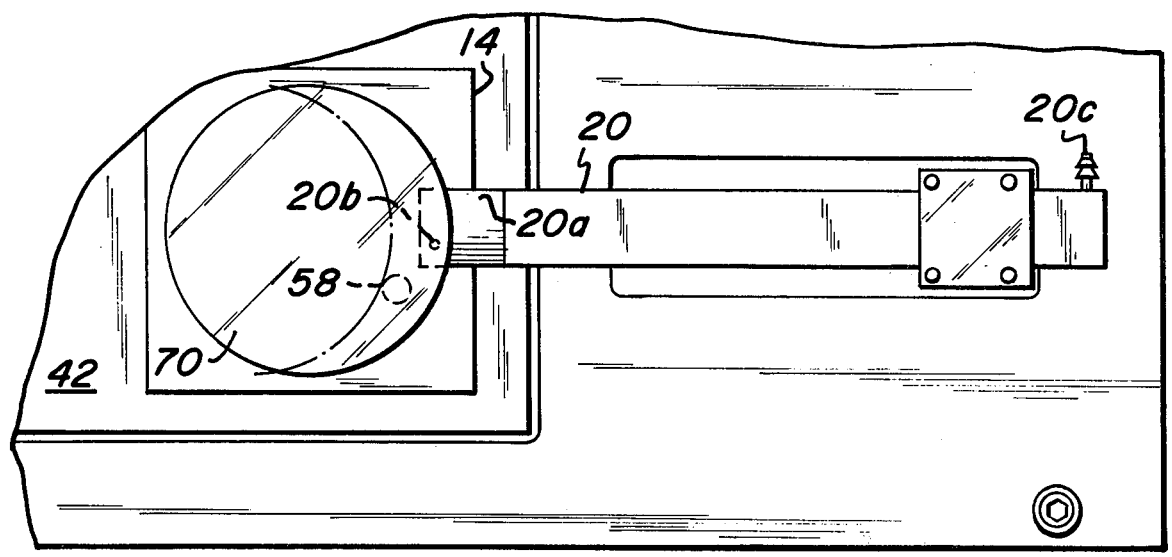
FIG. 3 is a top plan view of the wafer-supporting arm in its retracted position.

As shown in FIG. 3, arm 20 includes a cutout portion 20a for supporting a wafer 70 and also includes a pneumatic sensor 20b for sensing the receipt and removal of a wafer from portion 20a. A vacuum is applied to sensor 20b through a suitable hose connection 20c.

Figures 4, 5:
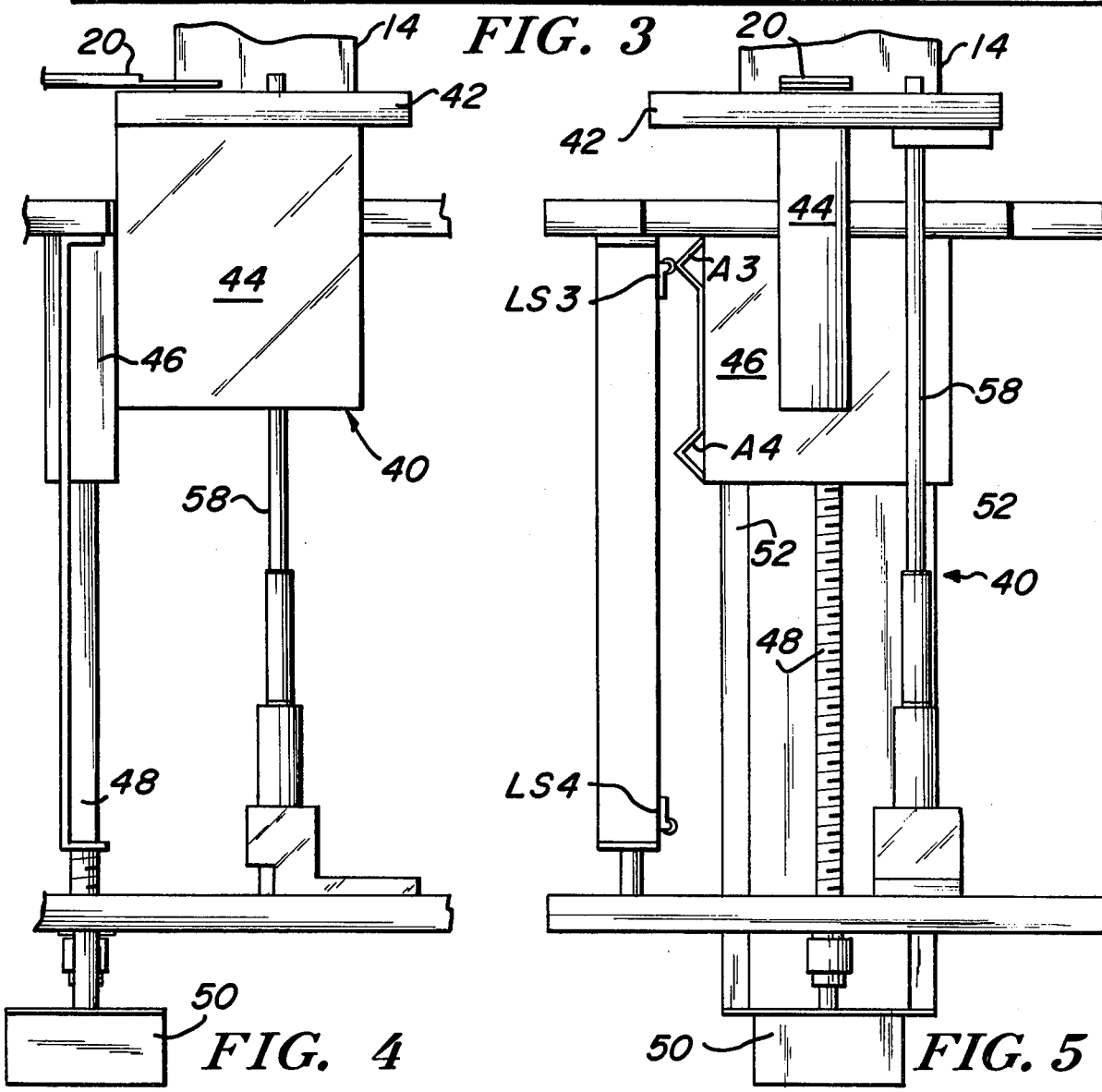
FIG. 4 is a side elevational view of the elevator mechanism for receiving and indexing the cassette.
FIG. 5 is another side elevational view of the elevator mechanism for moving the cassette.

Turning now to FIGS. 4 and 5, there is shown in greater detail a selection means including an elevator mechanism 40 for moving cassette 14 containing the silicon wafers in a vertical direction. Elevator mechanism 40 includes a platform 42 on which cassette 14 is adapted to be locked into position so that it is movable therewith. Platform 42 is connected by element 44 to a drive mechanism 46 which is movably mounted on a screw-threaded rod 48 which is rotated by a suitable motor 50 to move drive mechanism 46 along a pair of guide rods 52. In addition, frame 28 also has mounted thereon limit switches LS3 and LS4 which are adapted to be actuated by actuators A3 and A4 mounted on drive mechanism 46. Accordingly, as platform 42 of elevator mechanism 40 moves between its upper and lower positions, actuators A3 and A4 actuate limit switches LS3 and LS4, respectively, to perform the operations to be explained more fully below.

As also seen in FIGS. 4 and 5, there is provided a stop pin 58 which, as will be explained below, is adapted to enter the cassette 14 mounted on platform 42 so that when a silicon wafer is returned to the cassette 14, it will engage stop 58 so that the wafer is not inserted all the way into the cassette. As will be explained more fully, this is necessary so that as the cassette 14 and the previously returned silicon wafer are moved downwardly on elevator mechanism 40, the returned wafer does not interfere with the movement of wafer-supporting arm 20 into the cassette to load the next silicon wafer 70 to be scrubbed.

Figure 7:
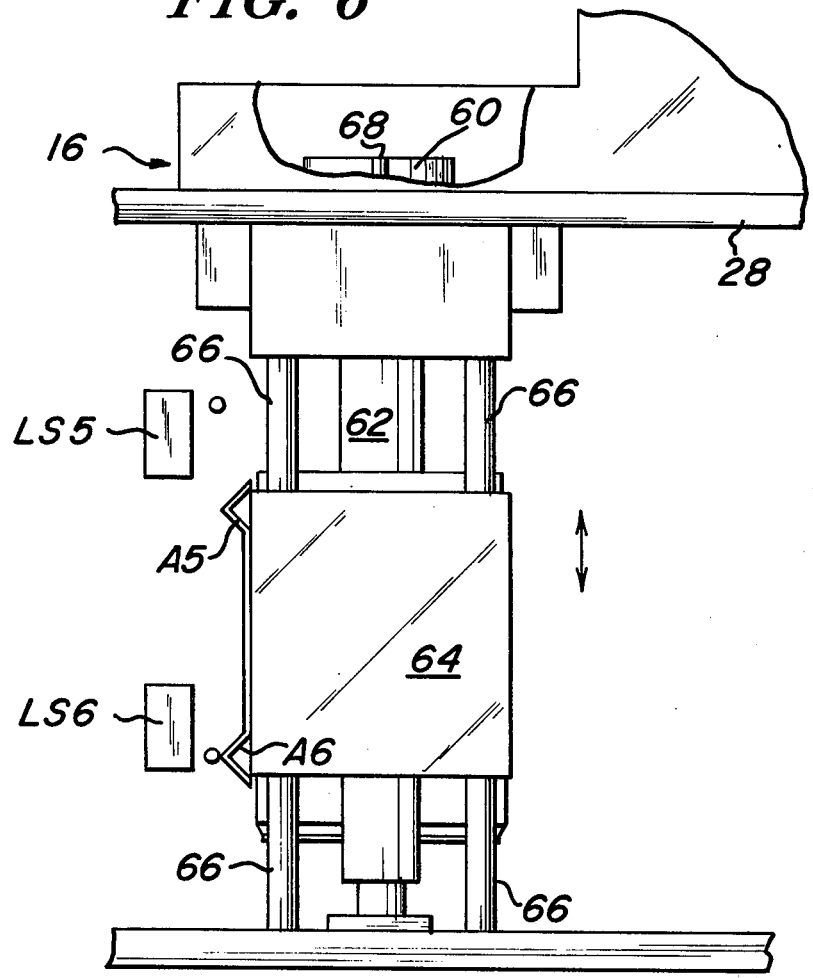
FIG. 7 is a side elevational view, with portions partially broken away for purposes of clarity, illustrating the chuck at the scrubbing station for receiving the silicon wafer to be scrubbed.

Now turning to FIG. 7, there is shown in greater detail the scrubbing station 16 mounted on frame 28. Scrubbing station 16 includes a pneumatically-operated chuck 60 which is vertically movable and is rotated by a motor (not shown). Chuck 60 is connected by an element 62 to a drive mechanism 64 which is slidably movable on guide rods 66 to move chuck 60 between its upper and lower positions. Chuck 60 also includes an internal pneumatic duct 68 which operates in conjunction with a controlled vacuum to apply suction to a silicon wafer deposited on chuck 60 to thereby hold the silicon wafer in position on chuck 60 while it is being scrubbed by brush assembly 18, in a manner to be explained.

Scrubbing station 16 is also provided with limit switches LS5 and LS6 adapted to be engaged by actuators A5 and A6 mounted on drive mechanism 64. Accordingly, as chuck 60 and drive mechanism 64 move between their upper and lower positions, actuators A5 and A6 are adapted to engage limit switches LS5 and LS6 to perform the operations to be explained more fully below.

Figure 6:
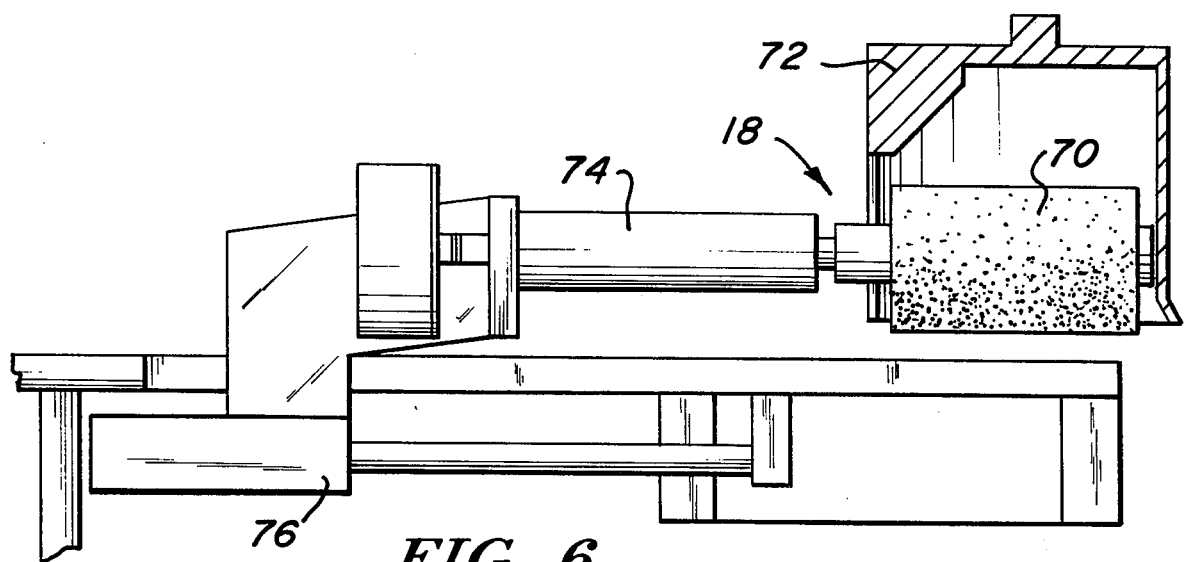
FIG. 6 is a side elevational view of the brush assembly for precision cleaning of a silicon wafer at the scrubbing station.

The brush assembly 18 is shown most clearly in FIG. 6 and includes a brush 70 that is movable into and out of a housing 72 by a piston 74 controlled by a pneumatic cylinder 76 in a conventional manner. During the scrubbing operation, housing 72 is moved into and out of position over chuck 60 to scrub the silicon wafer mounted on chuck 60. The brush 70 is moved into and out of the housing 72 when the housing is in position over chuck 60 so that the brush 70 operates to scrub the silicon wafer in a conventional manner. Typically, the scrub cycle operates as follows. Brush assembly 18 is actuated in position over chuck 60 while chuck 60 and the silicon wafer 70 to be scrubbed rotate together. Inorganic detergent and water are then injected into the housing 72 so that as the brush 70 rotates, the silicon wafer is scrubbed. The brush 70 is then retracted, and the silicon wafer is rinsed with water. Then the housing 72 is retracted, and as the chuck 60 continues to rotate, the silicon wafer is spin dried and is ready to be returned to cassette 14. It should be noted that cassette 14 includes a plurality of slots or shelves 14a for receiving wafers 70.

Figure 8:
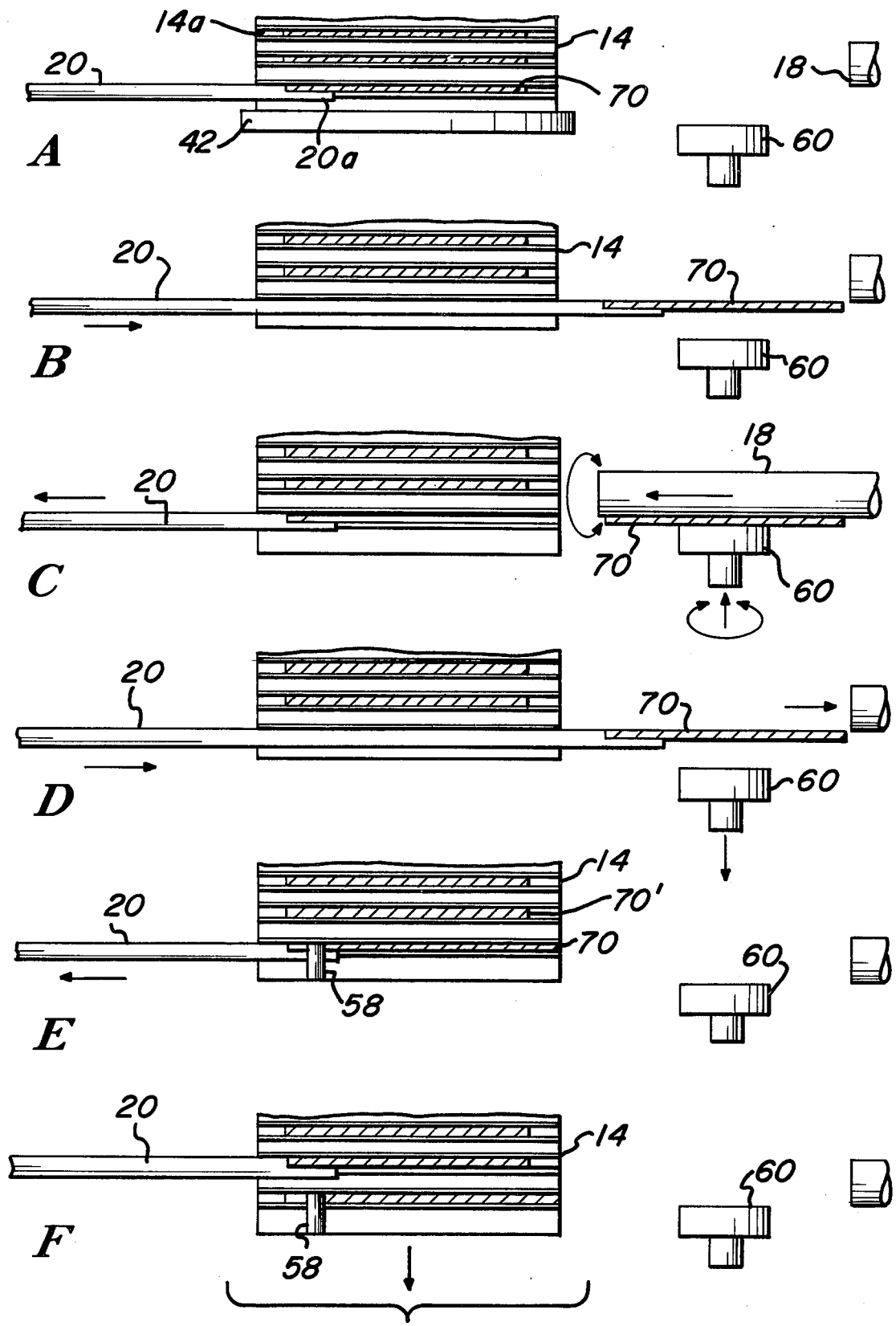
FIG. 8 is a sequence of diagrammatic illustrations depicting the sequence of operations of the apparatus of the present invention.

Now turning to FIG. 8, a general description of the overall operation of the automated scrubber of the present invention will be provided. As shown in position A, wafer-supporting arm 20 is in its retracted position, cassette 14 is mounted on platform 42 and is ready to have its lowermost silicon wafer 70 withdrawn therefrom, chuck 60 is in its lowermost position, and brush assembly 18 is in its retracted position. In position B, wafer-supporting arm 20 is moved from its retracted position through cassette 14 so that the lowermost silicon wafer 70 in cassette 14 is deposited in recess 20a formed on wafer-supporting arm 20. As wafer-supporting arm 20 continues to move in its forward direction, silicon wafer 70 is brought into position over chuck 60 to be deposited thereon.

As will be explained, during actual operation, cassette 14 will be moving downwardly, and lowermost wafer 70 will engage pneumatic sensor 20b. This condition causes motor 50 to be deactivated so that platform 42 and cassette 14 stop movement at the descended position as soon as the wafer engages the pneumatic sensor of the wafer-supporting arm 20. Pneumatic sensor 20b also operates to actuate drive mechanism 24 to move wafer-supporting arm 20 to its position at the scrubbing station over chuck 60. When drive mechanism 24 moves the wafer-supporting arm 20 all the way to its extended position at the scrubbing station 16, actuator A2 on drive mechanism 24 engages limit switch LS2 to cause chuck 60 to ascend.

As shown in position C of FIG. 8, chuck 60 moves upwardly to its ascended position and lifts silicon wafer 70 off of the wafer-supporting arm 20, thereby breaking the vacuum of pneumatic sensor 20b. As explained above, the vacuum in chuck 60 then operates to hold the silicon wafer 70 in position thereon. Accordingly, when two conditions occur, that is, when the vacuum in pneumatic sensor 20b is broken and when actuator A5 engages limit switch LS5 indicating that chuck 60 is in its upper position, wafer-supporting arm 20 will then be retracted. When wafer-supporting arm 20 reaches its retracted position, actuator A1 of drive mechanism 24 engages limit switch LS1 to actuate drive mechanism 64 of chuck 60 downwardly. When chuck 60 reaches its lower position, actuator A6 engages limit switch LS6, and this condition causes the scrubbing cycle to start.

In a conventional manner, the scrubbing cycle takes place. That is, brush assembly 18 moves into position over chuck 60 and the silicon wafer 70 to be scrubbed. Then, during the scrubbing cycle, detergent is applied so that brush 70 rotates and operates to scrub the surface of wafer 70. Then, water is injected into housing 72, and the wafer is rinsed. Chuck 60 is then rotated at high speed to spin dry wafer 70. When this is completed, rotation of chuck 60 is braked to a halt. Although not shown in the drawings, the scrubbing cycle is controlled by a series of timers in a conventional manner. However, in accordance with the present invention, the last timer on the scrubbing cycle operates to break the chuck vacuum so that wafer 70 may be removed from chuck 60. In addition, the last timer of the scrubbing cycle also operates to cause drive mechanism 64 to move chuck 60 to its upper position. When chuck 60 reaches its upper position, actuator A5 engages limit switch LS5 which operates to energize drive mechanism 24 to move wafer-supporting arm 20 to its extended position at scrubbing station 16. This is shown most clearly in position D of FIG. 8.

As also seen in position D of FIG. 8, chuck 60 is then actuated to move downwardly in response to arm 20 moving to its extended position and actuating limit switch LS2. As chuck 60 moves downwardly, it thereby deposits the scrubbed wafer 70 on recess 20a of wafer-supporting arm after the chuck vacuum is broken. As chuck 60 moves downwardly, actuator A5 is disengaged from limit switch LS5, and this condition causes wafer-supporting arm 20 and the scrubbed silicon wafer 70 to move towards the retracted position in cassette 14.

As shown in position E of FIG. 8, as wafer-supporting arm 20 and silicon wafer 70 are retracted, the silicon wafer 70 returns to its slot 14a in cassette 14, and the silicon wafer engages stop pin 58 so that the scrubbed silicon wafer is not inserted all the way into its slot in the cassette and thereby remains slightly laterally displaced with respect to those wafers 70 above it. In this manner, the lowermost scrubbed wafer 70 is in a position within the cassette such that it will not interfere with the pneumatic sensing of the next wafer 70' above it to be processed when cassette 14 moves downwardly so that the next wafer 70' engages wafer-supporting arm 20. When scrubbed wafer 70 engages stop pin 58, wafer-supporting arm 20 continues to move to its completely retracted position inside of cassette 14. In this manner, scrubbed wafer 70 is removed from wafer-supporting arm 20, and the vacuum of pneumatic sensor 20b is broken. When this occurs, and when the wafer-supporting arm 20 has moved to its completely retracted position so that actuator A1 of drive mechanism 24 engages limit switch LS1, these conditions allow the motor 50 to be operated to cause platform 42 and the cassette 14 mounted thereon to move downwardly so that the next wafer 70' in cassette 14 is in position to be transferred to the scrubbing station. Platform 42 and cassette 14 continue to move downwardly until pneumatic sensor 20b of wafer-supporting arm 20 engages and senses the next wafer 70' to be scrubbed. At that time, pneumatic sensor 20b operates to discontinue operation of motor 50 so that platform 42 and cassette 14 stop at the incrementally lower position. This is shown most clearly in position F of FIG. 8.

Accordingly, the above cycle is repeated until each wafer 70 within cassette 14 is transferred to the scrubbing station 16 and returned to the cassette. When the last wafer is returned to the cassette, platform 42 is indexed downwardly, and actuator A4 engages limit switch LS4 indicating that all of the wafers within the cassette have been processed. As a result, limit switch LS4 operates to automatically reset the apparatus by returning platform 42 to its upper position so that the completed cassette 14 can be removed and to receive a new cassette to be processed. Platform 42 continues moving upwardly until actuator A3 engages limit switch LS3 at which time the upward movement of platform 42 is discontinued, and the platform 42 is then in position to receive the next cassette of silicon wafers to be processed.

A latitude of modification, change, and substitution is intended in the foregoing disclosure and, in some instances, some features of the invention will be employed without a corresponding use of other features. Accordingly, it is appropriate that the appended claims be construed broadly and in a manner consistent with the spirit and scope of the invention herein.

What is claimed is:

1. Apparatus for transferring a selected one of a plurality of silicon wafers from within a cassette containing said wafers to a scrubbing station, comprising:
   a frame;
   said frame comprising a scrubbing station;
   cassette-receiving means for receiving a cassette in a position adjacent to said scrubbing station;
   selection means for selecting one of the silicon wafers contained in said cassette which is to be transferred to said scrubbing station; and
   a wafer-transfer arm operatively associated with said selection means and movable between a retracted position and said scrubbing station for moving said selected one of said silicon wafers from its position within said cassette to said scrubbing station and for returning said one silicon wafer from said scrubbing station to said cassette, said cassette being longitudinally aligned between the retracted position of said wafer-transfer arm and said scrubbing station on said frame.

2. The apparatus of claim 1 wherein said transfer means further includes drive means for moving said wafer-transfer arm between said retracted position and said scrubbing station, said arm passing through said cassette during the movement between said retracted position and said scrubbing station.

3. The apparatus of claim 1 wherein said wafer-supporting arm includes a portion for receiving said one silicon wafer, and a sensor formed in said portion for sensing the receipt and removal of said one silicon wafer from said portion of said wafer-supporting arm.

4. The apparatus of claim 1 wherein said scrubbing station includes a chuck for receipt of said one silicon wafer to be scrubbed, and a sensor on said chuck for sensing the receipt of said one silicon wafer, said chuck including means for actuating movement of said wafer-supporting arm.

5. The apparatus of claim 4 wherein said chuck actuating means includes first and second limit switches, said chuck being operable to actuate said first limit switch to cause said wafer-supporting arm to move to and from said scrubbing station, and said chuck being operable to actuate said second limit switch to cause said wafer-supporting arm to move to and from said retracted position.

6. The apparatus of claim 4 wherein said wafer-supporting arm includes means for actuating movement of said chuck in response to movement of said wafer-supporting arm between said retracted position and said scrubbing station.

7. The apparatus of claim 6 wherein said wafer-supporting arm actuating means includes third and fourth limit switches, said wafer-supporting arm being operable to actuate said third limit switch to cause said chuck to move in a first and second direction and being operable to actuate said fourth limit switch to cause said chuck to move in a first and second direction.

8. The apparatus of claim 1 wherein said scrubbing station includes a chuck for receipt of said one silicon wafer to be scrubbed, and means operable in response to movement of said chuck for actuating said wafer-supporting arm between said retracted position and said scrubbing station.

9. The apparatus of claim 8 wherein said arm-actuating means includes third and fourth limit switches, said wafer-supporting arm being operable in position at said scrubbing station to actuate said third limit switch to cause said chuck to move in a first direction and being operable in said retracted position to actuate said fourth limit switch to cause said chuck to move in a second direction.

10. The apparatus of claim 1 wherein said cassette-receiving means includes a platform for receiving said cassette, and said selection means including means for actuating said platform incrementally between first and second positions in response to said wafer-supporting arm being in said retracted position in said cassette.

11. The apparatus of claim 10 wherein said wafer-supporting arm includes a sensor for sensing the receipt of said one silicon wafer, said sensor being operable upon engagement with said one silicon wafer to de-energize said platform-actuating means to discontinue movement of said platform between said first and second positions.

12. The apparatus of claim 1 wherein said cassette includes stop means for removing said one silicon wafer from said wafer-supporting arm during movement of said arm and said one silicon wafer from said scrubbing station to said retracted position in said cassette.

13. Apparatus for transferring a selected one of a plurality of workpieces from within a cassette containing said workpieces in a vertical orientation to a processing station, comprising:
   a frame;
   said frame comprising a processing station;
   cassette-receiving means for receiving a cassette in a position adjacent to said processing station;
   selection means for sequentially selecting each of the workpieces contained in said cassette which is to be transferred to said processing station; and
   a work-transfer arm operatively associated with said selection means and movable between a retracted position and said scrubbing station for sequentially transferring each of said workpieces from its position within said cassette to said processing station and for sequentially returning each of said workpieces from said processing station to said cassette, said cassette being longitudinally aligned between the retracted position of said work-transfer arm and said processing station on said frame.

14. The apparatus of claim 13 wherein said transfer means further includes drive means for moving said work-transfer arm between said retracted position and said processing station, said arm passing through said cassette during the movement between said retracted position and said processing station.

15. The apparatus of claim 13 wherein said processing station includes a chuck for receipt of said workpiece, said chuck including means for actuating movement of said work-transfer arm.

16. The apparatus of claim 15 wherein said work-transfer arm includes means for actuating movement of said chuck in response to movement of said work-transfer arm between said retracted position and said processing station.

17. The apparatus of claim 13 wherein said cassette-receiving means includes a platform for receiving said cassette, and said selection means including means for actuating said platform incrementally between first and second positions in response to said work-transfer arm being in said retracted position.

* * * * *